(12) United States Patent
Carpenter et al.

(10) Patent No.: US 8,754,518 B1
(45) Date of Patent: Jun. 17, 2014

(54) DEVICES AND METHODS FOR CONFIGURING CONDUCTIVE ELEMENTS FOR A SEMICONDUCTOR PACKAGE

(71) Applicants: Burton J. Carpenter, Austin, TX (US); Derek S. Swanson, Austin, TX (US)

(72) Inventors: Burton J. Carpenter, Austin, TX (US); Derek S. Swanson, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/746,874

(22) Filed: Jan. 22, 2013

(51) Int. Cl.
*H01L 23/48* (2006.01)

(52) U.S. Cl.
USPC ........... 257/692; 257/676; 257/690; 257/773; 257/786; 257/E23.043; 257/E23.07

(58) Field of Classification Search
USPC .......... 257/676, 690, 692, 773, 786, E23.043, 257/E23.07
See application file for complete search history.

(56) References Cited

U.S. PATENT DOCUMENTS

| | | | |
|---|---|---|---|
| 5,343,366 A * | 8/1994 | Cipolla et al. | 361/785 |
| 5,898,213 A | 4/1999 | Torres et al. | |
| 5,962,926 A | 10/1999 | Torres et al. | |
| 6,476,506 B1 | 11/2002 | O'Connor et al. | |
| 6,812,580 B1 | 11/2004 | Wenzel et al. | |
| 6,853,090 B2 * | 2/2005 | Kim et al. | 257/784 |
| 6,916,995 B2 | 7/2005 | Seaman et al. | |

* cited by examiner

*Primary Examiner* — Thanh V Pham
(74) *Attorney, Agent, or Firm* — Mary Jo Bertani

(57) ABSTRACT

A semiconductor device includes a package substrate having a plurality of conductive elements, each of the conductive elements including a conductive trace and a bond finger positioned at an end of the conductive trace. The bond fingers can be arranged on the package substrate in at least three groups. A first group of the three groups can include a first number of the bond fingers. A third group of the three groups can include a third number of the bond fingers. A second group of the three groups can include an intermediate number of the bond fingers. The intermediate number is between the first and the third numbers. Spacing between the conductive elements along the length of the conductive elements is approximately the same.

16 Claims, 2 Drawing Sheets

DEVICES AND METHODS FOR CONFIGURING CONDUCTIVE ELEMENTS FOR A SEMICONDUCTOR PACKAGE

BACKGROUND

1. Field

This disclosure relates generally to semiconductor devices, and more specifically, to configurations of conductive elements for semiconductor devices.

2. Related Art

As integrated circuits continue to evolve, lithography dimensions continue to decrease. Present day lithography is in the range of 0.028-0.50 micron. As a result, the semiconductor die continues to decrease in size. As a result of the decreased size of the semiconductor die, packaging issues are created that heretofore were non-existent. The decrease in semiconductor die size results in bond posts which are external to the die being removed farther and farther from the die in the semiconductor package, which encapsulates the die. As a result, the wires used to connect bond pads on the semiconductor die to bond posts in the package are becoming increasingly longer. Another issue is the high pin count resulting from increased integration afforded by the miniaturization. As a result of increased pin count, more pads per side of a package have to be included. The addition of pads to a side of an integrated circuit further increases the wire length because more bond posts have to be added farther from the side of the integrated circuit die.

Long wire length is problematic for several reasons. A first reason is the fact that long wire lengths result in many integrity problems such as shorting caused by wire sweep. Wire sweeping occurs when the encapsulant used to encapsulate the die is poured into a cavity and causes the wires to move from their original locations and contact each other. Additional issues with increased wire length include the degradation of electrical performance of the integrated circuit package.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and devices disclosed herein provide optimized configurations for conductive elements on package substrates for semiconductor devices. The conductive elements include a conductive trace and a bond finger or bond pad at one end of the conductive trace. The bond fingers are arranged in three or more rows or groups, with each successive group having the same or higher number of conductive elements than the previous group. The group with the largest number of conductive elements can be placed the closest to a component on the substrate to which the conductive elements will be connected. The group with the next largest number of conductive elements is placed the next closest to the component, and so on. The groups with lower numbers of bond pads are interspersed between the conductive traces of the group(s) with the higher number(s) of bond pads. The configurations of the conductive elements take advantage of the decreased width of the conductive traces compared to the width of the bond fingers. In particular, the paths of the conductive traces associated with groups having higher numbers of bond pads are altered to make room for bond fingers of the groups with lower numbers of bond fingers. Required minimum spacing between conductive elements is met while the number of bond fingers in a given area is increased. The higher density of conductive elements provides a larger number of connections to the component without requiring an increased amount of substrate.

Figure 1:
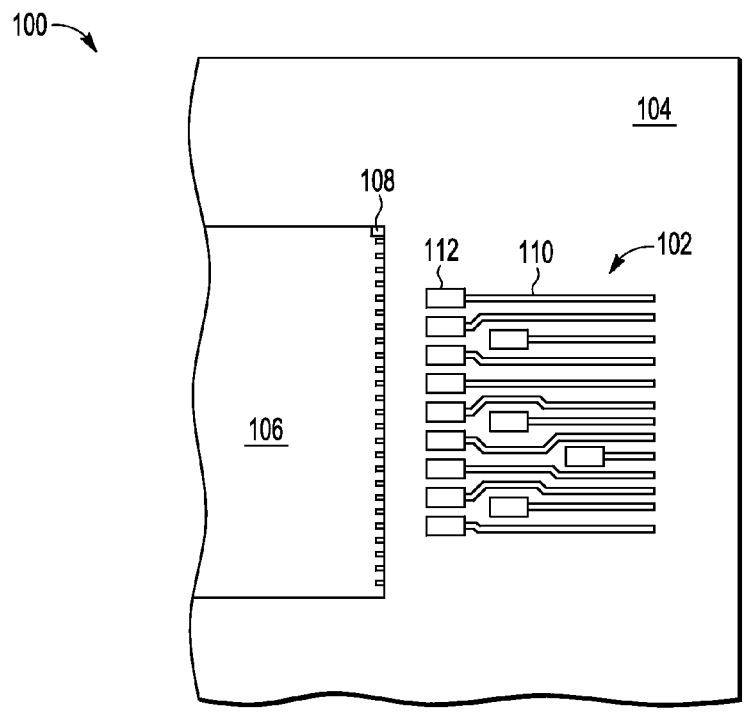
FIG. 1 illustrates in a partial top plan view of a semiconductor device configured with conductive elements on an integrated circuit package substrate in accordance with the present disclosure.

FIG. 1 illustrates a partial top plan view of a semiconductor device 100 configured with conductive elements 102 on an integrated circuit package substrate 104 in accordance with the present disclosure. An integrated circuit (IC) die 106 or other electronic component is also mounted on substrate 104 adjacent to conductive elements 102. Electrically conductive contacts 108 are located around one or more of the edges of IC die 106. The contacts 108 are connected to circuitry in IC die 106. Conductive elements 102 lead to other components (not shown) on substrate 102 to establish an electrical connection between IC die 106 and the other component(s). A wire bond (not shown) or other suitable electrical connection can be formed between each contact 108 and a respective conductive element 102. Although conductive elements 102 are shown adjacent one edge of IC die 106, additional conductive elements 102 can be included adjacent other edges of IC die 106, as well as other components on substrate 104.

Substrate 104 described herein can be any epoxy, FR-4, FR-5, BT, ceramic, polyimide, silicon the like, and combinations of the above.

Conductive elements 102 (also referred to as conductors) may be used to transfer one or more various types of information, such as data, addresses, control, or status. The conductors 102 as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, a plurality of conductors may be replaced with a single conductor that transfers multiple signals serially or in a time multiplexed manner. Likewise, single conductors carrying multiple signals may be separated out into various different conductors carrying subsets of these signals.

Figure 2:
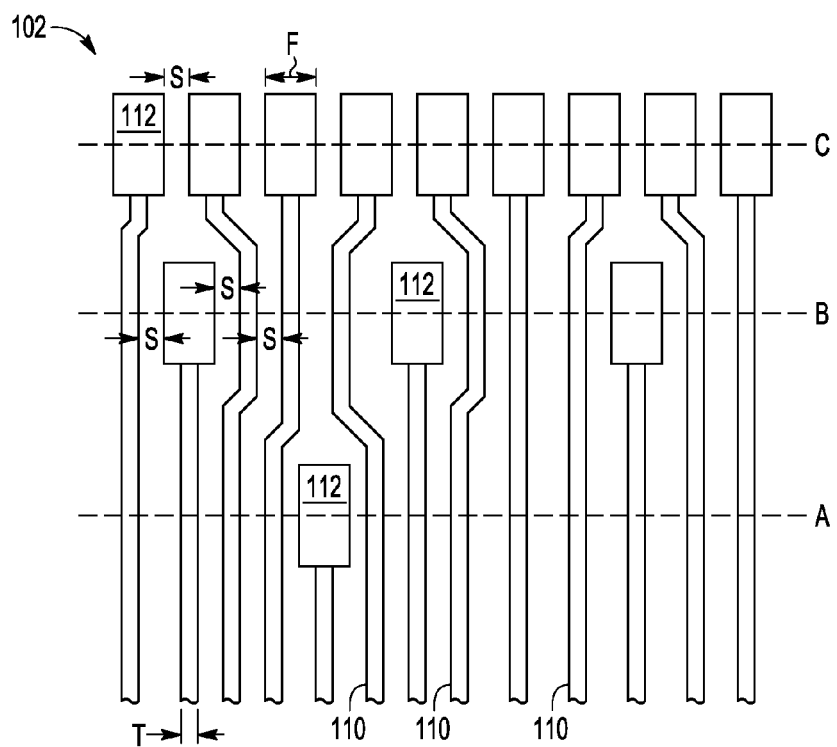
FIG. 2 illustrates in a top plan view of a conductive element configuration in accordance with the present disclosure.

FIG. 2 illustrates in a top plan view of a configuration of conductive elements 102 in accordance with the present disclosure. Conductive elements 102 typically include an electrically conductive trace 110 and a bond finger or pad 112 formed at one or more ends of conductive trace 110. Bond fingers 112 are positioned as close as feasible adjacent an edge of die 106. In the configuration shown, bond fingers 112 are laid out in three groups, with a first group A including one bond pad, a second group B including 3 bond pads, and a third group C including 9 bond pads. Note that other configurations can include additional conductive elements 102 or fewer conductive elements 102. Also, other embodiments could use flip chip (FC) attach pads instead of wirebond pads.

In order to achieve a high density of bond fingers 112 in relation to space required on substrate 104, groups A, B, and C are staggered with respect to one another. Specifically, group C is positioned the closest to the edge of IC die 106, group B is positioned the next closest to the edge of IC die 106, and group A is positioned further from the edge of IC die than groups B and C. Groups A, B and C may be arranged in rows, with each row having a different distance from the edge of IC die 106 and each bond finger 112 in a row being approximately the same distance from the edge of IC die 106 as other bond fingers 112 in the group, within manufacturing tolerances. Alternatively, bond fingers 112 within groups A, B and C may be staggered with respect to one another, with no bond finger 112 in groups A or B being closer to the edge of the IC die 106 than any of the bond fingers 112 of group C; and no bond finger 112 in a group A being closer to the edge of the IC die 106 than any of the bond fingers 112 of groups B or C.

Bond fingers 112 are typically wider than conductive traces 110. The path of one or more traces 110 associated with groups B and C are altered to be closer to each other to make space to fit bond fingers 112 from another group in among the traces 110 of the group. In the example shown, a leftmost bond finger 112 of row B is positioned between the first and second leftmost traces 110 of group C. A center bond finger 112 of row B is positioned between the fourth and fifth traces 110 (from the left) of group C. A rightmost bond finger 112 of row A is positioned between the second and third traces 110 (from the right) of group C. The single bond finger 112 of group A is positioned between the third and fourth traces 110 (from the left) of group C.

Figure 3:
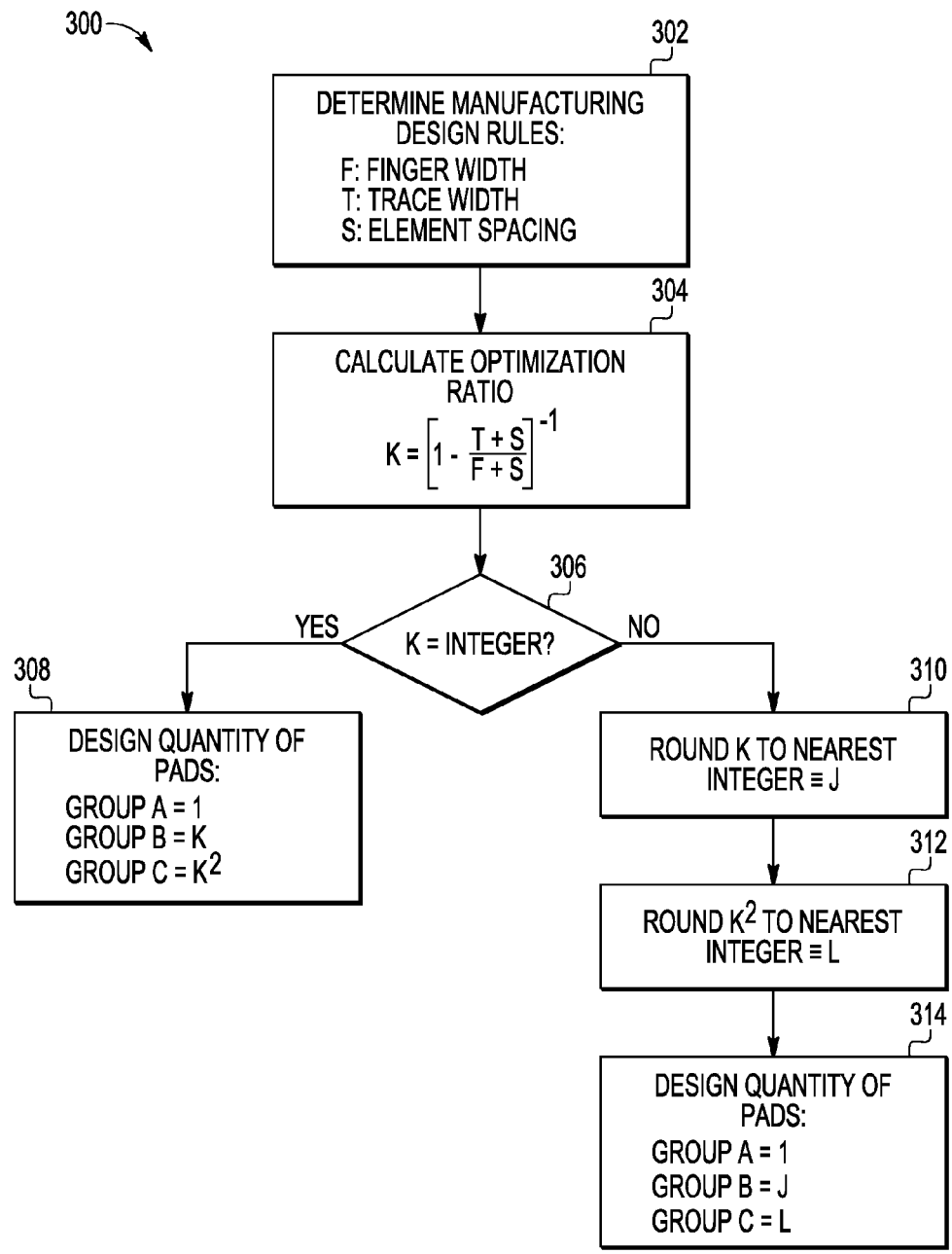
FIG. 3 shows a flow diagram of an embodiment of a method for configuring conductive elements for a semiconductor device in accordance with the present disclosure.

Note that other configurations of bond fingers 112 are possible. As an example, FIG. 3 shows a flow diagram of an embodiment of a method 300 for configuring bond fingers for a semiconductor device in accordance with the present disclosure. Process 302 includes determining manufacturing design rules for the layout of conductive elements 102 including the width (F) of bond fingers 112, the width (T) of traces 110, and spacing (S) to be maintained between conductive elements 102. The spacing between conductive elements 102 is typically chosen to be as small as possible, but still ensure high manufacturing yield. The design rules are typically used to layout electronic circuits using electronic design automation (EDA) tools such as the Cadence SIP tool from Cadence Design Systems in San Jose, Calif.

Process 304 includes calculating an optimization ratio that is used to determine the number of bond fingers 112 in each group. In some embodiments, the ratio is determined using the following equation (1):

$$K = \left[1 - \frac{T+S}{F+S}\right]^{-1} \quad \text{Equation (1)}$$

where T is the width of the traces 110, F is the width of the bond fingers 112, and S is the spacing between conductive elements 102.

Process 306 includes determining whether the value of K is an integer value. If K is an integer value, process 306 transitions to process 308 in which the quantity of bond fingers 112 is determined. In the example shown, the number of bond fingers 112 in group A is one (1), the number of bond fingers 112 in group B is K, and the number of bond fingers 112 in group C is $K^2$. If the value of K is not an integer, then process 310 rounds K up to the nearest integer to a value denoted as J in FIG. 3 and process 312 rounds $K^2$ up to the nearest integer to a value denoted as L in FIG. 3. For example, if K is 2.3, the value of J will be the nearest integer 2 and the value of L will be 5 (i.e., $2.3^2$=5.29, which is rounded to 5, the nearest integer). In the example shown, when K is not an integer, process 314 sets the number of bond fingers 112 in group A to one (1), the number of bond fingers 112 in group B to J, and the number of bond fingers 112 in group C to L.

Note that more than three groups of bond fingers 112 can be used. For example, for a configuration with four groups of bond fingers 112 where K is an integer, the first group can have 1 bond finger, the second group can have K bond fingers, the third group can have $K^2$ bond fingers, and the fourth group can have $K^3$ bond fingers. For a configuration with four groups of conductive elements 102 where K is not an integer, the first group can have 1 bond finger, the second group can have J bond fingers, the third group can have L bond fingers, and the fourth group can have M bond fingers, where M is the value of K to the 3rd power and rounded up to the nearest integer. For a configuration with N groups, each group could have $K^{G-1}$ conductive elements, if K is an integer, where G is the group number. For a configuration with N groups where K is not an integer, the value of K is taken to the G−1 power and rounded to the nearest integer.

By now it should be appreciated that in some embodiments, a semiconductor device 100 can comprise a package substrate 104 having a plurality of conductive elements 102, each of the conductive elements including a conductive trace 110 and a bond finger 112 positioned at an end of the conductive trace. The bond fingers can be arranged on the package substrate in at least three groups (A, B, C). A first group of the three groups can include a first number of the bond fingers. A third group of the three groups can include a third number of the bond fingers. A second group of the three groups can include an intermediate number of the bond fingers. The intermediate number is between the first and the third numbers. Spacing between the conductive elements along the length of the conductive elements is approximately the same.

In another aspect, the first, second and third groups can correspond to respective first, second and third rows.

In another aspect, the second group can be positioned between the first group and the third group.

In another aspect, the first number can be one, the intermediate number can be an integer number, and the third number can be the square of the intermediate number.

In another aspect, the intermediate number can be based on spacing (S) between the conductive elements plus width of the conductive traces (T) divided by width of the bond fingers (F) plus the spacing between the conductive elements.

In another aspect, the intermediate number can be based on an inverse of a first quantity of (one minus a second quantity), the second quantity being (spacing between the conductive elements plus width of the conductive traces) divided by (width of the bond fingers plus the spacing between the conductive elements).

In another aspect, the number of bond fingers in the first group can be one, the number of bond fingers in the second group can be K, and the number of bond fingers in each of subsequent groups can be $K^{(N-1)}$, where N is a group number.

In another aspect, the device can further comprise a die 106 mounted on the substrate, with the first, second and third groups at different distances from an edge of the die.

In another embodiment, a method can comprise determining manufacturing design rules for a semiconductor device including a width of bond fingers (F), a width of conductive traces (T), and spacing between conductive elements (S). Each of the conductive elements can include one of the bond fingers 112 at an end of a corresponding one of the conductive traces 110, and the spacing can be the same between the conductive elements 102. A first group (C) of the bond fingers can be positioned at a first distance from a component of the semiconductor device. A second group (B) of the bond fingers can be positioned at a second distance from the component. A third group of the bond fingers can be positioned at a third distance (A) from the component. The second distance can be between the first distance and the third distance and a number of bond fingers in the second group can be greater than a number of bond fingers in the first group.

In another aspect, the number of bond fingers in the second group can be less than a number of bond fingers in the third group.

In another aspect, the method can further comprise determining the number of bond fingers in the second group (304) by inverting a first quantity of one minus a second quantity, the second quantity being spacing between conductive elements plus width of the conductive traces divided by width of bond fingers plus the spacing between conductive elements.

In another aspect, the method can further comprise, if the number of bond fingers in the second group is an integer (306), a number of bond fingers in the third group can be determined by squaring the number of bond fingers in the second group (308).

In another aspect, the method can further comprise, if the number of bond fingers in the second group is not an integer, a rounded second number can be determined by rounding the number of bond fingers in the second group to a nearest integer (310); and the number of bond fingers in the third group can be determined by rounding a squared number of bond fingers in the second group to the nearest integer (312).

In yet another embodiment, a semiconductor device 100 can comprise a first group (C) of the bond fingers 112 positioned at a first distance from a specified location on a substrate 104, a second group (B) of the bond fingers positioned at a second distance from the specified location, and a third group (A) of the bond fingers positioned at a third distance from the specified location. The second distance can be between the first distance and the third distance and a number of bond fingers in the second group can be greater than a number of bond fingers in the first group. Each of the bond fingers can be positioned at an end of a corresponding one of the conductive traces 110 to form a conductive element 102, and spacing can be approximately the same between the conductive elements.

In another aspect, the number of bond fingers in the second group can be less than a number of bond fingers in the third group.

In another aspect, the number of bond fingers in the second group can be based on the inverse of a first quantity of (one minus a second quantity), the second quantity being: (spacing between the conductive elements plus width of the conductive traces) divided by (width of the bond fingers plus spacing between the conductive elements) (304).

In another aspect, if the number of bond fingers in the second group is an integer, a number of bond fingers in the third group can be based on squaring the number of bond fingers in the second group (308).

In another aspect, if the second number is not an integer, a rounded second number is based on rounding the number of bond fingers in the second group to a nearest integer (310). A number of bond fingers in the third group can be the square of the number of bond fingers in the second group rounded to the nearest integer (312).

In another aspect, the number of bond fingers in the first group is one, the number of bond fingers in the second group can be K, and a number of bond fingers in each of subsequent groups of bond fingers can be $K^{(N-1)}$, where N is a group number (308).

In another aspect, the third distance can be closer to the specified location than the first and second distance, and the second distance can be closer to the specified location than the first distance.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Some of the above embodiments, as applicable, may be implemented using a variety of different information processing systems. For example, method 300 of FIG. 3 may be implemented as a software program that is executed by a computer system used to design semiconductor packages. Those skilled in the art will recognize that the boundaries between logic blocks of FIG. 3 are merely illustrative and that alternative embodiments may merge logic blocks or circuit elements or impose an alternate decomposition of functionality upon various logic blocks or circuit elements. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

The term "software program," as used herein, is defined as a sequence of instructions designed for execution on a computer system. Software, a program, or software program, may include a subroutine, a function, a procedure, an object method, an object implementation, an executable application, an applet, a servlet, a source code, an object code, a shared library/dynamic load library and/or other sequence of instructions designed for execution on a computer system. A computer program is typically stored internally on computer readable storage medium or transmitted to the computer system via a computer readable transmission medium. An operating system control operation of the CPU and main memory units as well as application programs.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    a package substrate having a plurality of conductive elements, each of the conductive elements including a conductive trace and a bond finger positioned at an end of the conductive trace, wherein
        the bond fingers are arranged on the package substrate in at least three groups,
        a first group of the three groups includes a first number of the bond fingers,
        a third group of the three groups includes a third number of the bond fingers, and
        a second group of the three groups includes an intermediate number of the bond fingers, the intermediate number is between the first and the third numbers,
        spacing between the conductive elements along the length of the conductive elements is approximately the same, wherein the intermediate number is based on an inverse of a first quantity of one minus a second quantity, the second quantity being spacing between the conductive elements plus width of the conductive traces divided by width of the bond fingers plus the spacing between the conductive elements.

2. The device of claim 1, wherein the first, second and third groups correspond to respective first, second and third rows.

3. The device of claim 1 wherein the second group is positioned between the first group and the third group.

4. The device of claim 1, wherein the first number is one, the intermediate number is an integer number, and the third number is the square of the intermediate number.

5. The device of claim 1, wherein the number of bond fingers in the first group is one, the number of bond fingers in the second group is K, and the number of bond fingers in each of subsequent groups is $K^{(N-1)}$, where N is a group number.

6. The device of claim 1 further comprising:
    a die mounted on the substrate, the first, second and third groups are at different distances from an edge of the die.

7. A method comprising:
    determining manufacturing design rules for a semiconductor device including a width of bond fingers, a width of conductive traces, and spacing between conductive elements, wherein each of the conductive elements include one of the bond fingers at an end of a corresponding one of the conductive traces, and the spacing is the same between the conductive elements;
    determining a number of bond fingers in the second group by inverting a first quantity of one minus a second quantity, the second quantity being spacing between conductive elements plus width of the conductive traces divided by width of bond fingers plus the spacing between conductive elements;
    positioning a first group of the bond fingers at a first distance from a component of the semiconductor device;
    positioning a second group of the bond fingers at a second distance from the component; and
    positioning a third group of the bond fingers at a third distance from the component, wherein the second distance is between the first distance and the third distance and the number of bond fingers in the second group is greater than a number of bond fingers in the first group.

8. The method of claim 7, wherein the number of bond fingers in the second group is less than a number of bond fingers in the third group.

9. The method of claim 7, further comprising:
    if the number of bond fingers in the second group is an integer, determining a number of bond fingers in the third group by squaring the number of bond fingers in the second group.

10. The method of claim 7, further comprising:
    if the number of bond fingers in the second group is not an integer,
        determining a rounded second number by rounding the number of bond fingers in the second group to a nearest integer; and
        determining the number of bond fingers in the third group by rounding a squared number of bond fingers in the second group to the nearest integer.

11. A semiconductor device comprising:
    a first group of the bond fingers positioned at a first distance from a specified location on a substrate;
    a second group of the bond fingers positioned at a second distance from the specified location; and
    a third group of the bond fingers positioned at a third distance from the specified location, wherein the second distance is between the first distance and the third distance and a number of bond fingers in the second group is greater than a number of bond fingers in the first group,
    each of the bond fingers are positioned at an end of a corresponding one of the conductive traces to form a conductive element, and spacing is approximately the same between the conductive elements;
    the number of bond fingers in the second group is based on the inverse of a first quantity of one minus a second quantity, the second quantity being spacing between the conductive elements plus width of the conductive traces divided by width of the bond fingers plus spacing between the conductive elements.

12. The device of claim 11, wherein the number of bond fingers in the second group is less than a number of bond fingers in the third group.

13. The device of claim 11, further comprising:
    if the number of bond fingers in the second group is an integer, a number of bond fingers in the third group is based on squaring the number of bond fingers in the second group.

14. The device of claim 11, further comprising:
    if the second number is not an integer,
        a rounded second number is based on rounding the number of bond fingers in the second group to a nearest integer; and
        a number of bond fingers in the third group is the square of the number of bond fingers in the second group rounded to the nearest integer.

15. The device of claim 11, wherein the number of bond fingers in the first group is one, the number of bond fingers in the second group is K, and a number of bond fingers in each of subsequent groups of bond fingers is $K^{(N-1)}$, where N is a group number.

16. The device of claim 15, wherein the third distance is closer to the specified location than the first and second distance, and the second distance is closer to the specified location than the first distance.

* * * * *